(12) United States Patent
Hung et al.

(10) Patent No.: US 8,669,639 B2
(45) Date of Patent: Mar. 11, 2014

(54) SEMICONDUCTOR ELEMENT, MANUFACTURING METHOD THEREOF AND OPERATING METHOD THEREOF

(75) Inventors: Chih-Ling Hung, Taipei (TW); Chien-Wen Chu, Yangmei Township, Taoyuan County (TW); Hsin-Liang Chen, Taipei (TW); Wing-Chor Chan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 78 days.

(21) Appl. No.: 13/493,311

(22) Filed: Jun. 11, 2012

(65) Prior Publication Data

US 2013/0328170 A1    Dec. 12, 2013

(51) Int. Cl.
*H01L 29/735*    (2006.01)

(52) U.S. Cl.
USPC .... 257/566; 257/367; 257/409; 257/E29.009; 257/E29.212; 438/140; 438/454

(58) Field of Classification Search
USPC .................. 257/367, 409, 566, 575, E29.009, 257/E29.121; 438/140, 454
See application file for complete search history.

(56) References Cited

U.S. PATENT DOCUMENTS

| | | | | |
|---|---|---|---|---|
| 6,194,761 B1 * | 2/2001 | Chiozzi et al. | | 257/328 |
| 6,924,531 B2 * | 8/2005 | Chen et al. | | 257/336 |
| 7,109,562 B2 * | 9/2006 | Lee | | 257/488 |
| 8,410,557 B2 * | 4/2013 | Yoneda et al. | | 257/409 |
| 2008/0044955 A1 * | 2/2008 | Salcedo et al. | | 438/140 |
| 2008/0265329 A1 * | 10/2008 | Hirler et al. | | 257/367 |

* cited by examiner

*Primary Examiner* — Allan R Wilson
(74) *Attorney, Agent, or Firm* — McClure, Qualey & Rodack, LLP

(57) ABSTRACT

A semiconductor element, a manufacturing method thereof and an operating method thereof are provided. The semiconductor element includes a substrate, a first well, a second well, a third well, a fourth well, a bottom layer, a first heavily doping region, a second heavily doping region, a third heavily doping region and a field plane. The first well, the bottom layer and the second well surround the third well for floating the third well and the substrate. The first, the second and the third heavily doping regions are disposed in the first, the second and the third wells respectively. The field plate is disposed above a junction between the first well and the fourth well.

10 Claims, 6 Drawing Sheets

110P 130N
110P

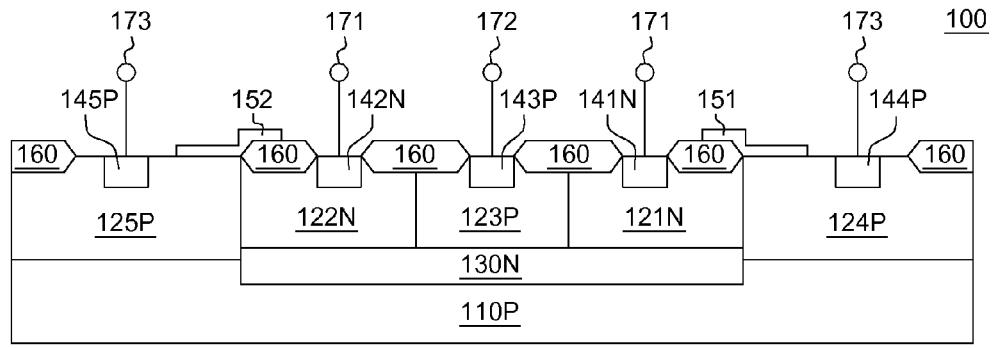
FIG. 2F
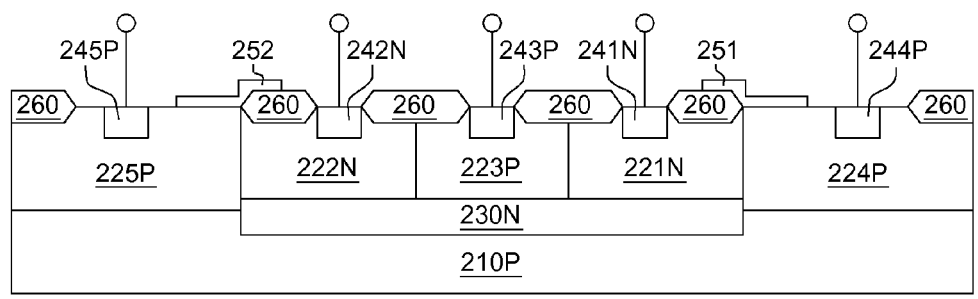
FIG. 3
210P
FIG. 4A

SEMICONDUCTOR ELEMENT, MANUFACTURING METHOD THEREOF AND OPERATING METHOD THEREOF

BACKGROUND

1. Technical Field

The disclosure relates in general to a semiconductor element, a manufacturing method thereof and an operating method thereof.

2. Description of the Related Art

With the development of semiconductor technology, varied semiconductor elements are invented. For example, memories, transistors and diodes are widely used in electric devices.

In the development of semiconductor technology, researchers try to improve those semiconductor elements, such as reducing the volume, increasing/reducing the turn on voltage, increasing/reducing the breakdown voltage, reducing the electric leakage and solving the ESD issue.

SUMMARY

The disclosure is directed to a method of a semiconductor element, a manufacturing method thereof and an operating method thereof.

According to a first aspect of the present disclosure, a semiconductor element is provided. The semiconductor element comprises a substrate, a first well, a second well, a third well, a fourth well, a bottom layer, a first heavily doping region, a second heavily doping region, a third heavily doping region and a field plate. The first well is disposed on the substrate. The second well is disposed on the substrate. The third well is disposed on the substrate and located between the first well and the second well. The fourth well is disposed on the substrate and connected to the first well. The bottom layer is disposed below the second well. The first well, the bottom layer and the second well surround the third well for floating the third well and the substrate. The first heavily doping region is disposed in the first well. The second heavily doping region is disposed in the second well. The third heavily doping region is disposed in the third well. The field plate is disposed above a junction between the first well and the fourth well. Each of the first well the second well, the bottom layer, the first heavily doping region and the second heavily doping region has a first type doping. Each of the substrate, the third well, the fourth well, and the third heavily doping region has a second type doping. The first type doping is complementary to the second type doping.

According to a second aspect of the present disclosure, a manufacturing method of a semiconductor element is provided. The manufacturing method of the semiconductor element comprises the following steps. A substrate is provided. A bottom layer, an epitaxy layer, a first well and a second well are formed on the substrate. The first well and the second well are disposed in the epitaxy layer. The bottom layer is disposed bellow the first well and the second well. A third well and a fourth well are formed in the epitaxy layer. The third well is located between the first well and the second well, the fourth well is connected to the first well. The first well, the bottom layer and the second well surround the third well for floating the third well and the substrate. A field plate is formed above a junction between the first well and the fourth well. A first heavily doping region and a second heavily doping region are respectively formed in the first well and the second well. A third heavily doping region is formed in the third well. Each of the first well the second well, the bottom layer, the first heavily doping region and the second heavily doping region has a first type doping. Each of the substrate, the third well, the fourth well, and the third heavily doping region has a second type doping. The first type doping is complementary to the second type doping.

According to a third aspect of the present disclosure, an operating method of a semiconductor element is provided. The semiconductor element comprises a substrate, a first well, a second well, a third well, a fourth well, a bottom layer, a first heavily doping region, a second heavily doping region, a third heavily doping region and a field plate. The first well, the second well, the third well and the third well are disposed on the substrate. The third well is located between the first well and the second well. The fourth well is connected to the first well. The bottom layer is disposed below the second well. The first well, the bottom layer and the second well surround the third well for floating the third well and the substrate. The first heavily doping region, the second heavily doping region and the third heavily doping region are disposed in the first well, the second well and the third well respectively. The field plate is disposed above a junction between the first well and the fourth well. Each of the first well the second well, the bottom layer, the first heavily doping region and the second heavily doping region has a first type doping. Each of the substrate, the third well, the fourth well, and the third heavily doping region has a second type doping. The first type doping is complementary to the second type doping, and the operating method comprises the following steps. The first heavily doping region is electrically connected to a first electrode. The third heavily doping region is electrically connected to a second electrode.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIG. 1 shows a cross-section view of a semiconductor element of a first embodiment;

FIGS. 2A to 2F illustrate a manufacturing method of the semiconductor element of the first embodiment;

FIG. 3 shows a cross-section view of a semiconductor element of a second embodiment;

FIGS. 4A to 4E illustrate a manufacturing method of the semiconductor element of the second embodiment;

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

First Embodiment

Figures 1, 2A, 2B:
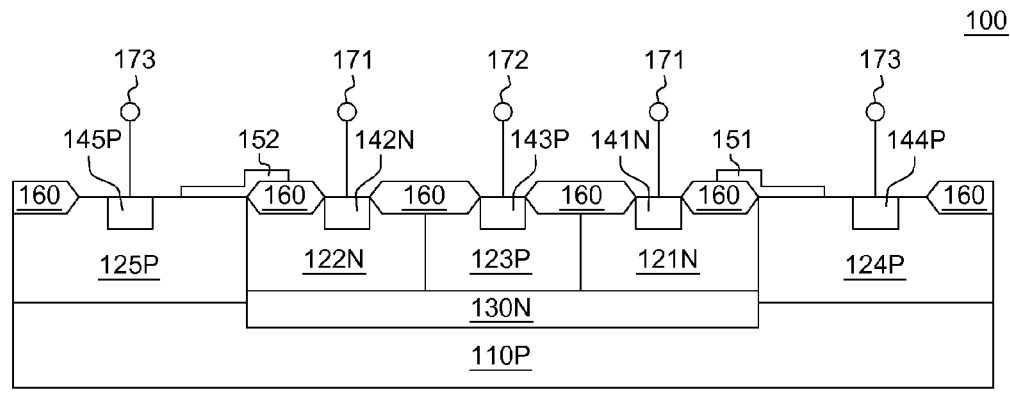

Please referring to FIG. 1, a cross-section view of a semiconductor element 100 of the first embodiment is shown. The semiconductor element 100 at least includes a substrate 110, a first well 121N, a second well 122N, a third well 123P, a fourth well 124P, a bottom layer 130N, a first heavily doping region 141N, a second heavily doping region 142N, a third heavily doping region 143P and a filed plate 151.

The material of the substrate 110P can be P type silicon or N type silicon, for example. The first well 121N, the second well 122N, the third well 123P and the fourth well 124P are disposed on the substrate 110P. The third well 123P is located between the first well 121N and second well 122N. The fourth well 124P is connected to the first well 121N. The first well 121N, the second well 122N, the third well 123P and the fourth well 124P can be P type well or N type well, for example.

The bottom layer 130N is disposed below the second well 123P. In the present embodiment, the bottom layer 130N is a barrier layer, such as a N type barrier layer (NBL) or a P type barrier layer (PBL) for example.

The first heavily doping region 141N, the second heavily doping region 142N and the third heavily doping region 143P are disposes in the first well 121N, the second well 122N and the third well 123P respectively. The doping concentration of the first heavily doping region 141N, the second heavily doping region 142N and the third heavily doping region 143P are larger than the doping concentration of the first well 121N, the second well 122N and the third well 123P. The first heavily doping region 141N, the second heavily doping region 142N and the third heavily doping region 143P can be P type heavily doping regions (P+) or N type heavily doping regions (N+), for example.

The filed plate 151 is disposed above a junction between the first well 121N and the fourth well 124P. The material of the filed plate 151 can be polysilicon, for example.

Each of the first well 121N, the second well 122N, the bottom layer 130N, the first heavily doping region 141N and the second heavily doping region 142N has a first type doping, such as P type doping or N type doping for example. Each of the substrate 110P, the third well 123P, the fourth well 124P and the third heavily doping region 143P has a second type doping, such as N type doping or P type doping for example. The first type doping is complementary to the second type doping. In the present embodiment, the first type doping is the N type doping, and the second type doping is the P type doping.

The first well 121N, the bottom layer 130N and the second well 122N surround the third well 123P and the first type doping of the first well 121N, the bottom layer 130N and the second well 122N is complementary to the second type doping of the third well 123P for floating the third well 123P and the substrate 110P.

Moreover, the semiconductor element 100 of the present embodiment further includes a fifth well 125P, a fourth heavily doping region 144P, a fifth heavily doping region 145P, a plurality of field oxides 160 and another filed plate 152. The fourth heavily doping region 144P and the fifth heavily doping region 145P are disposed in the fourth well 124P and fifth well 125P respectively. The fifth well 125P, the fourth heavily doping region 144P and the fifth heavily doping region 145P have the second type doping.

The field oxides 160 are disposed above the junctions among the first well 121N, the second well 122N, the third well 123P, the fourth well 124P and the fifth well 125P. The material of the field oxides 160 can be silicon oxide (SiO2) for example. The filed plate 151, 152 are partially disposed on one of the field oxides 160.

Regarding the operating method of the semiconductor element 100, the first heavily doping region 141N is electrically connected to a first electrode 171, the third heavily doping region 143P is electrically connected to a second electrode 172, and the fourth heavily doping region 144P is electrically connected to a third electrode 173. The first electrode 171 can be a cathode electrode, the second electrode 172 can be an anode electrode, the third electrode 173 can be a ground electrode, for example. Due to the effect of the filed plate 151, the breakdown voltage of the junction between the first well 121N and the fourth well 124P is larger than that between the first well 121N and the third well 123P. Therefore, the current will not flow through the junction between the first well 121N and the fourth well 124P; instead, the current will flow through the junction between first well 121N and the third well 123P. Thus, the semiconductor element 100 can be prevented from the electric leakage.

A path through the first electrode 171, the first heavily doping region 141N, the first well 121N, the third well 123P, the third heavily doping region 143P and the second electrode 172 forms an isolation diode. While the isolation diode is applied a forward biased voltage, there is an impedance which is at least 0.7 V. While the isolation diode is applied a reverse biased voltage, there is an impedance which is at least 30 V.

Moreover, the second heavily doping region 142N can be electric connected to a first electrode 171, the third heavily doping region 143P can be electrically connected to the second electrode 172, and the fifth heavily doping region 145P can be electric connected to the third electrode 173. The first electrode 171 can be a cathode electrode, the second electrode 172 can be an anode electrode, and the third electrode 173 can be a ground electrode for example. Due to the effect of the filed plate 152, the breakdown voltage of the junction between the second well 122N and the fifth well 125P is larger than that between the second well 122N and the third well 123P. Therefore, the current will not flow through the junction between the second well 122N and the fifth well 125P; instead, the current will flow through the junction between the second well 122N and the third well 123P.

A path through the first electrode 171, the second heavily doping region 142N, the second well 122N, the third well 123P, the third heavily doping region 143P and the second electrode 172 forms an isolation diode. While the isolation diode is applied a forward biased voltage, there is an impedance which is at least 0.7 V. While the isolation diode is applied a reverse biased voltage, there is an impedance which is at least 30 V.

Please refer to FIGS. 2A to 2F, a manufacturing method of the semiconductor element 100 of the first embodiment is illustrated. Firstly, referring to FIG. 2A, the substrate 110P is provided.

Then, referring to FIG. 2B, the bottom layer 130N is formed on the substrate 110P. In the present embodiment, the bottom layer 130N is a barrier layer.

Figure 2C:
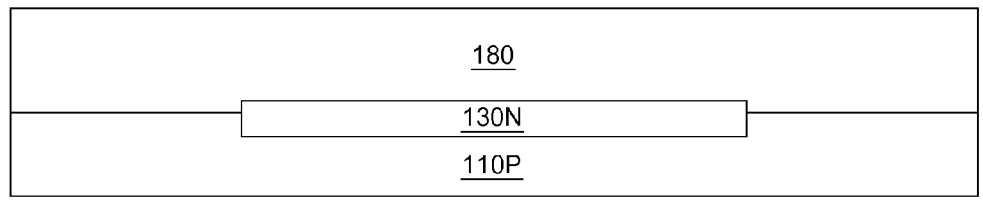

Afterwards, referring to FIG. 2C, an epitaxy layer 180 is formed on the substrate 110P and the bottom layer 130N.

Figure 2D:
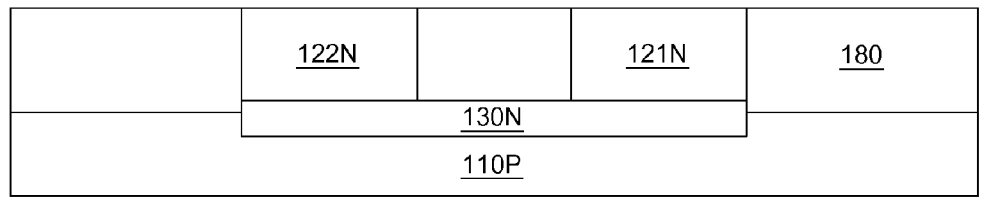

Then, referring to FIG. 2D, the first well 121N and the second well 122N is formed on the substrate 110P. The first well 121N and the second well 122N is located in the epitaxy layer 180, the bottom layer 130N is located below the first well 121N and the second well 122N.

Figure 2E:
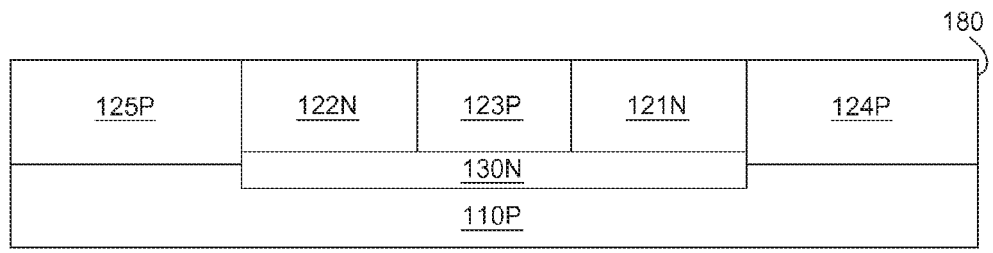

Afterwards, referring to FIG. 2E, the third well 123P, the fourth well 124P and the fifth well 125P are formed in the epitaxy layer 180. The third well 123P is located between the first well 121N and the second well 122N. The fourth well 124P is connected to the first well 121N, and the fifth well 125P is connected to the second well 122N. The first well 121N, the bottom layer 130N and the second well 122N surround the third well 123P for floating the third well 123P and the substrate 110P.

Next, referring to FIG. 2F, the field oxides (FOX) 160 are formed on the junctions among the first well 121N, the second well 122N, the third well 123P, the fourth well 124P and the fifth well 125P.

Afterwards, referring to FIG. 2F, the filed plates 151, 152 are formed above the junction between the first well 121N and the fourth well 124P, and formed above the junction between the second well 122N and the fifth well 125P.

Then, referring to FIG. 2F, the first heavily doping region 141N and the second heavily doping region 142N are formed in the first well 121N and the second well 122N.

Afterwards, referring to FIG. 2F, the third heavily doping region 143P, the fourth heavily doping region 144P and the fifth heavily doping region 145P are formed in the third well 123P, the fourth well 124P and the fifth well 125P respectively. Base on the above steps, the semiconductor element 100 can be manufactured. The semiconductor element 100 of the present embodiment can be manufactured by the Bipolar-CMOS-DMOS (BCD) process without any additional mask or step.

Second Embodiment

Please referring to FIG. 3, a cross section view of a semiconductor element 200 of the second embodiment is shown. The semiconductor element 200 of the present embodiment is different from the semiconductor element 100 of the first embodiment in a bottom layer 230N, and the similarities are not repeated here.

Referring to FIG. 3, the material of the bottom layer 230N, a first well 221N and a second well 222N are substantially the same. The bottom layer 230N, the first well 221N and the second well 222N form a deep well 290N (shown in FIG. 4C), the third well 223P is formed in the deep well 290N. Therefore, the third well 223P is surrounded by the bottom layer 230N, the first well 221N and the second well 222N for floating the third well 223P and a substrate 210P.

Please referring to FIGS. 4A to 4E, a manufacturing method of the semiconductor element 200 of the second embodiment is illustrated. The manufacturing method of the semiconductor element 200 of the second embodiment is different from the manufacturing method of the semiconductor element 100 of the first embodiment in the steps of forming the bottom layer 230N, the first well 221N and the second well 222N, and the similarities are not repeated here. Firstly, referring to FIG. 4A, the substrate 210P is provided.

Figure 4B:
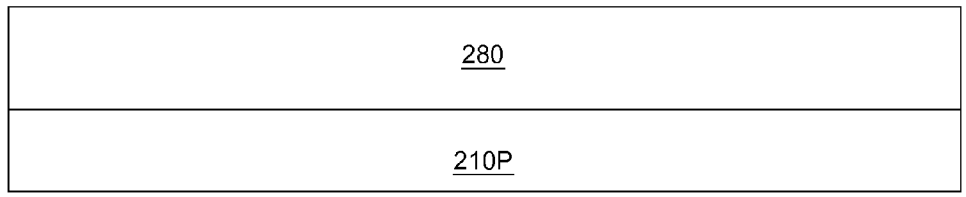

Then, referring to FIG. 4B, an epitaxy layer 280 is formed on the substrate 210P.

Figure 4C:
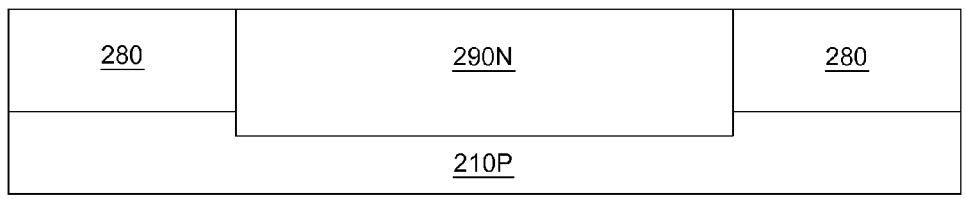

Afterwards, referring to FIG. 4C, the deep well 290N is formed in the epitaxy layer 280.

Figure 4D:
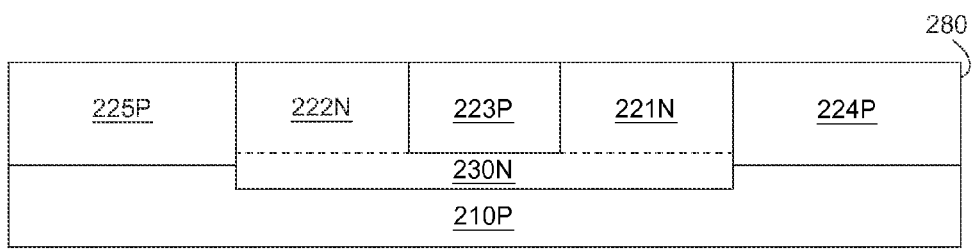

Then, referring to FIG. 4D, the third well 223P, a fourth well 224P and a fifth well 225P are formed in the epitaxy layer 280. While the third well 223P is formed, the first well 221N and the second well 222N and the bottom layer 230N are formed accordingly.

Figure 4E:
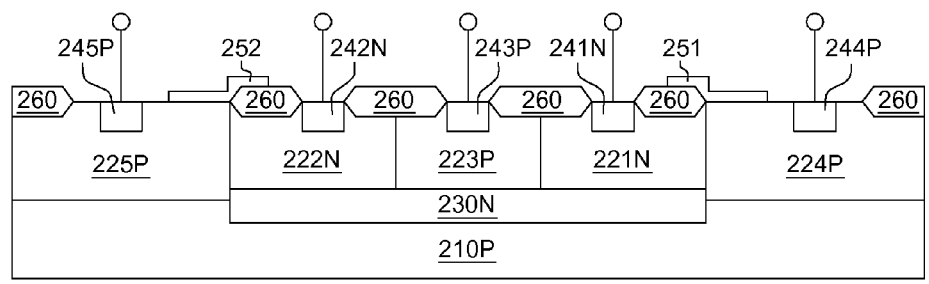

Afterwards, referring to FIG. 4E, a first heavily doping region 241N, a second heavily doping region 242N, a third heavily doping region 243P, a fourth heavily doping region 244P, a fifth heavily doping region 245P, field oxides 260 and filed plates 251, 252 are formed.

Third Embodiment

Figure 5:
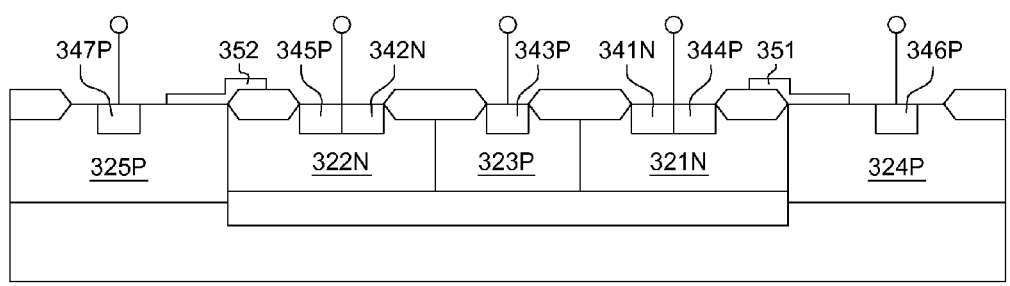
FIG. 5 shows a cross-section view of a semiconductor element of a third embodiment.

Please referring to FIG. 5, a cross section view of a semiconductor element 300 of the third embodiment is shown. The semiconductor element 300 of the third embodiment is different from the semiconductor element 100 of the first embodiment in that the semiconductor element 300 includes first to seventh heavily doping regions 341N, 342N, 343P, 344P, 345P, 346P, 347P. The first heavily doping region 341N and the fourth heavily doping region 344P are disposed in the first well 321N, the second heavily doping region 342N and the fifth heavily doping region 345P are disposed in the second well 322N, the third heavily doping region 343P is disposed in the third well 323P, the sixth heavily doping region 346P is disposed in the fourth well 324P, and the seventh heavily doping region 347P is disposed in the fifth well 325P.

In the present embodiment, each of the first well 321N, the second well 322N, the first heavily doping region 341N and the second heavily doping region 342N has first type doping. Each of the third well 323P, the fourth well 324P, the fifth well 325P, the third heavily doping region 343P, the fourth heavily doping region 344P, the fifth heavily doping region 345P, the sixth heavily doping region 346P and the seventh heavily doping region 347P has a second type doping.

That is to say, there are two different type heavily doping regions disposed in the first well 321N and the second well 322N both, such that the semiconductor element 300 forms an electro static discharge (ESD) element.

Moreover, the manufacturing method of the semiconductor element 300 of the present embodiment is different from the semiconductor element 100 of the first embodiment in that while third heavily doping region 343P are forming, the fourth heavily doping region 344P and the fifth heavily doping region 345P are formed in the first well 321N and the second well 322N, and the similarities are not repeated here.

Fourth Embodiment

Figure 6:
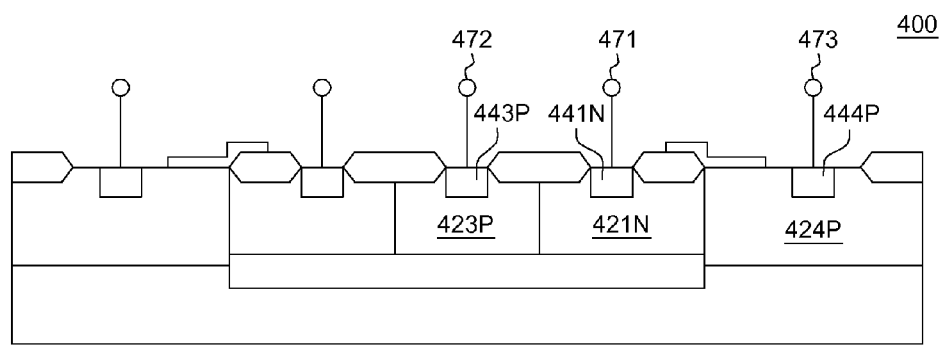
FIG. 6 shows a cross-section view of a semiconductor element of a fourth embodiment.

Please referring to FIG. 6, a cross section view of the semiconductor element 400 of the fourth embodiment is shown. The semiconductor element 400 of the present embodiment is different from the semiconductor element 100 of the first embodiment in an operating method, and the similarities are not repeated here.

Regarding the operating method of the semiconductor element 400 of the present embodiment, a first electrode 471 electrically connected to the first heavily doping region 441N is a base electrode, a second electrode 472 electrically connected to the third heavily doping region 443P is an emitter electrode, a third electrode 473 electrically connected to the fourth heavily doping region 444P is a collector electrode.

A PNP structure of the third well 423P, the first well 421N and the fourth well 424P forms a bipolar junction transistor (BJT). In some application, the BJT can be used as an amplifier.

Moreover, the BJT of the present embodiment not only can be independently used, but also can be combined with the isolation diode of the first embodiment in a single circuit. Therefore, the circuit can be created varied functions and the volume thereof can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
a substrate;
a first well, disposed on the substrate;
a second well, disposed on the substrate;

a third well, disposed on the substrate and located between the first well and the second well;

a fourth well, disposed on the substrate and connected to the first well;

a bottom layer, disposed below the second well, wherein the first well, the bottom layer and the second well surround the third well for floating the third well and the substrate;

a first heavily doping region, disposed in the first well;

a second heavily doping region, disposed in the second well;

a third heavily doping region, disposed in the third well; and a field plate, disposed above a junction between the first well and the fourth well;

wherein each of the first well the second well, the bottom layer, the first heavily doping region and the second heavily doping region has a first type doping; each of the substrate, the third well, the fourth well, and the third heavily doping region has a second type doping; and the first type doping is complementary to the second type doping.

2. The semiconductor element according to claim 1, wherein the bottom layer is a barrier layer.

3. The semiconductor element according to claim 1, wherein the material of the bottom layer, the first well and the second well are substantially the same, and the bottom layer, the first well and the second well form a deep well.

4. The semiconductor element according to claim 1, further comprising a field oxide (FOX), disposed on the junction between the first well and the fourth well.

5. The semiconductor element according to claim 1, further comprising:

a fourth heavily doping region, disposed in the first well and connected to the first heavily doping region; and a fifth heavily doping region, disposed in the second well and connected to the second heavily doping region;

wherein each of the fourth heavily doping region and the fifth heavily doping region has the second type doping.

6. A manufacturing method of a semiconductor element, comprising:

providing a substrate;

forming a bottom layer, an epitaxy layer, a first well and a second well on the substrate, wherein the first well and the second well are disposed in the epitaxy layer, and the bottom layer is disposed bellow the first well and the second well;

forming a third well and a fourth well in the epitaxy layer, wherein the third well is located between the first well and the second well, the fourth well is connected to the first well, and the first well, the bottom layer and the second well surround the third well for floating the third well and the substrate;

forming a field plate above a junction between the first well and the fourth well;

forming a first heavily doping region and a second heavily doping region in the first well and the second well respectively; and forming a third heavily doping region in the third well, wherein each of the first well the second well, the bottom layer, the first heavily doping region and the second heavily doping region has a first type doping; each of the substrate, the third well, the fourth well, and the third heavily doping region has a second type doping; and the first type doping is complementary to the second type doping.

7. The manufacturing method of the semiconductor element according to claim 6, further comprising:

forming a field oxide (FOX) on the junction between the first well and the fourth well.

8. The manufacturing method of the semiconductor element according to claim 6, wherein in the step of forming the third heavily doping region, a fourth heavily doping region and a fifth heavily doping region are formed in the first well and the second well respectively; the fourth heavily doping region is connected to the fourth heavily doping region; the fifth heavily doping region is connected to the second heavily doping region; and both the fourth heavily doping region and the fifth heavily doping region have the second type doping.

9. An operating method of a semiconductor element, wherein the semiconductor element comprises a substrate, a first well, a second well, a third well, a fourth well, a bottom layer, a first heavily doping region, a second heavily doping region, a third heavily doping region and a field plate; the first well, the second well, the third well and the third well are disposed on the substrate; the third well is located between the first well and the second well; the fourth well is connected to the first well; the bottom layer is disposed below the second well; the first well, the bottom layer and the second well surround the third well for floating the third well and the substrate; the first heavily doping region, the second heavily doping region and the third heavily doping region are disposed in the first well, the second well and the third well respectively; the field plate is disposed above a junction between the first well and the fourth well; each of the first well the second well, the bottom layer, the first heavily doping region and the second heavily doping region has a first type doping; each of the substrate, the third well, the fourth well, and the third heavily doping region has a second type doping; the first type doping is complementary to the second type doping; and the operating method comprises:

electrically connecting the first heavily doping region to a first electrode; and electrically connecting the third heavily doping region to a second electrode.

10. The operating method of the semiconductor element according to claim 9, wherein the first electrode is a cathode electrode, and the second electrode is an anode electrode.

* * * * *